United States Patent [19]

Dickinson et al.

[11] Patent Number: 4,548,890

[45] Date of Patent: Oct. 22, 1985

[54] WATER-BASED PHOTOPOLYMERIZABLE COMPOSITIONS AND THEIR USE

[75] Inventors: Peter Dickinson; Michael Ellwood, both of Broadstairs, England

[73] Assignee: Sericol Group Limited, London, England

[21] Appl. No.: 595,448

[22] Filed: Mar. 30, 1984

[30] Foreign Application Priority Data

Mar. 31, 1983 [GB] United Kingdom ............... 8309019

[51] Int. Cl.$^4$ .............................................. G03C 1/68
[52] U.S. Cl. ................................. 430/280; 430/292; 430/909; 430/914; 430/921; 430/925; 430/922; 430/926; 430/912; 204/159.18
[58] Field of Search ............ 430/280, 909, 914, 921, 430/922, 926, 912, 292, 925; 204/159.18

[56] References Cited

U.S. PATENT DOCUMENTS

| | | | |
|---|---|---|---|
| 3,637,382 | 1/1972 | Krauch | 430/292 X |
| 3,708,296 | 1/1973 | Schlesinger | 430/280 X |
| 3,782,952 | 1/1974 | Golda et al. | 430/280 |
| 4,069,054 | 1/1978 | Smith | 430/919 X |
| 4,136,102 | 1/1979 | Crivello | 430/270 X |
| 4,175,972 | 11/1979 | Crivello | 204/159.18 |
| 4,286,047 | 8/1981 | Bennett et al. | 204/159.18 X |
| 4,341,859 | 7/1982 | Keane et al. | 430/921 X |
| 4,378,277 | 3/1983 | Smith | 204/159.18 |
| 4,418,138 | 11/1983 | Curtis | 430/308 X |

FOREIGN PATENT DOCUMENTS

| | | | |
|---|---|---|---|
| 2904626 | 8/1979 | Fed. Rep. of Germany | 204/159.18 |
| 47-5126 | 2/1972 | Japan | 430/280 |
| 2100874A | 1/1983 | United Kingdom . | |

Primary Examiner—Richard L. Schilling
Assistant Examiner—Cynthia Hamilton
Attorney, Agent, or Firm—Cushman, Darby & Cushman

[57] ABSTRACT

Aqueous dispersions comprising water, a cationically curable compound, and a photosensitive onium salt, and preferably other ingredients such as sensitizers, fillers, and plasticizers, are useful for making printing screens, lithographic plates, and printed circuit resists. After exposure, the un-cured composition is easily removed by washing with water.

17 Claims, No Drawings

WATER-BASED PHOTOPOLYMERIZABLE COMPOSITIONS AND THEIR USE

DESCRIPTION

This invention provides photopolymerisable compositions useful for forming coatings which can be exposed in image-wise manner and then developed so as to remove the unexposed areas, e.g. by washing with water, to leave an image suitable for use as a stencil or resist.

Many resins are cationically curable. Epoxy resins, in particular, have been used in a variety of applications requiring high standards of chemical and mechanical resistance. Curing of epoxy resins is usually achieved by a 2 pack system utilising an active amine or carboxylic acid as the curing agent. The cure time of these compositions can be several hours and thorough mixing is required to ensure an even cure.

A one pack epoxy resin system can be formulated employing a Lewis Acid catalyst in the form of an amine complex such as the boron trifluoride monoethylamine complex. On heating, the Lewis Acid is released and cure occurs in 1 to 8 hours. The temperature required for curing may be 160° C. or higher. These one pack epoxy compositions cannot therefore be used to coat heat-sensitive substrates such as polymer films or mesh, nor can volatile reactive diluents be used because of evaporation losses during cure.

Certain photosensitive aryldiazonium salts can be employed to cure epoxy resins, see U.S. Pat. No. 3,708,296. On exposure to actinic radiation these aryldiazonium salts can decompose, releasing in situ a Lewis Acid catalyst capable of effecting rapid cure of the epoxy resin. However, decomposition of the aryldiazonium salts occurs in the dark and stabilisers must be added to minimise polymerisation during storage. Despite such measures gelation of the mixture is still liable to occur during dark storge. Nitrogen is released on exposure of these salts to actinic radiation and this can result in film imperfections. In addition aryldiazonium salts are thermally unstable and the use of such materials is hazardous because of the possibility of violent decomposition reactions.

U.S. Pat. Nos. 4,138,255 and 4,136,102 disclose one pack systems with long term stability containing iodonium or sulphonium salts having metal or metalloid halide anions e.g. $BF_4^-$, $PF_6^-$, $AsF_6^-$ or $SbF_6^-$. These catalysts can generate a Bronsted Acid on exposure to actinic radiation which can effect rapid cure of epoxy resins at ambient temperatures. The rapidity of the cure on exposure to actinic radiation makes it possible to produce an epoxy film useful for reprographic purposes. U.S. Pat. No. 4,193,799 discloses the use of an onium salt-sensitised epoxy film as a photoresist. When the coated film is exposed image-wise, the exposed areas polymerise to give an insoluble image. The unexposed areas may then be washed off using an organic solvent. However in large scale processes, the use of large amounts of organic solvents for development may create a fire hazard, and many solvents represent a toxicological and environmental hazard.

The present invention is based on the discovery that an onium salt sensitised composition can be emulsified in an aqueous system to give a composition capable of producing coated layers which cure rapidly on exposure to actinic radiation. The coated layer can be exposed imagewise and subsequently developed with water to provide a cured image which is mechanically and chemically resistant. The ease of development in aqueous media avoids the use of organic solvents with their attendant toxicological and fire hazards.

The compositions of the present invention are dispersions comprising water, at least one dispersed cationically curable compound, and one or more photosensitive onium salts as photoinitiators capable on exposure to actinic radiation of effecting cationic polymerisation of the said curable compound. Preferably the compositions also contain one or more surfactants and water-soluble colloids as dispersion stabilisers, and also spectral sensitizers which are normally necessary to increase the spectral sensitivity of the photoinitiator to the radiation used. The composition may also contain inert polymeric or inorganic fillers, reactive diluents, plasticisers, biocides, defoamers, pigments, or dyes, which may change colour on exposure to actinic radiation as described in British specification No. 2100874 corresponding to U.S. application Ser. No. 629,759 filed July 13, 1984 as a divisional of application Ser. No. 389,487 filed June 17, 1982 and now abandoned. The preferred onium salt photoinitiators are iodonium and sulphonium salts. The iodonium salts may have the formula:

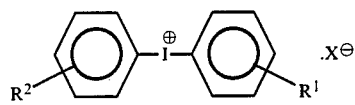

where each of $R_1$ and $R_2$ is selected from hydrogen, halogen, straight or branched alkyl, alkoxy, aryl, acyl, nitro, or cyano, and $X^-$ is tetrafluoroborate, hexafluorophosphate, hexafluoroarsenate, hexafluoroantimonate, perchlorate, or trifluoromethanesulphate.

The sulphonium salts may be of the formula:

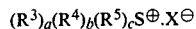

where $X^-$ is as defined above, $R^3$ is a monovalent aromatic radical which may be substituted by one or more alkyl (including substituted alkyl), aryl, alkoxy, hydroxy, phenoxy, thiophenoxy, mercaptan or acyl groups or halogen atoms; $R^4$ is an organic aliphatic radical selected from alkyl, cycloalkyl and substituted alkyl; $R^5$ is a polyvalent organic radical forming a heterocyclic or fused ring structure with $S^+$, a is a whole number from 0 to 3 inclusive, b is a whole number from 0 to 2 inclusive, and c is 0 or 1, and a+b+c=3.

Such photoinitiators are used in the new compositions in a proportion of 1% to 10%, and preferably 1% to 5%, by weight. Preferred photoinitiators of the aforesaid formulae are 4,4'-dimethyldiphenyliodonium hexafluorophosphate, diphenyliodonium hexafluorophosphate, triphenylsulphonium hexafluorophosphate, and 4-thiophenoxyphenyl-S-diphenylsulphonium hexafluorophosphate.

A sensitiser is preferably added to increase the spectral sensitivity of the photoinitiator. The preferred sensitisers are 9,10-diethoxyanthracene and 2-alkyl-9,10-diethoxyanthracene in a proportion of 0–5%, preferably 0 to 3%, by weight of the composition. Polyaromatic compounds and phenothiazine may also be used.

Cationically photopolymerisable materials which may be included in the present invention include cyclic formals and acetals, vinyl ethers, cyclic ethers, lactones, polysiloxanes, urea-formaldehyde resin, melamine-formaldehyde resins, and epoxides. A more comprehensive list is detailed in "Cationic Polymerisation of Olefins: A Critical Inventory" J. P. Kennedy, Wiley Interscience Pub. 1975. Epoxy resins are particularly preferred as they are readily available and the resulting cured polymers possess excellent dimensional and thermal stability in addition to superior mechanical strength and chemical resistance. A wide range of epoxy and epoxy substituted compounds can be used in photopolymerisation processes, thus making it relatively easy to obtain cured resins with specifically desired chemical and physical properties.

The epoxy resins preferably used contain a plurality of epoxy groups and may be based on the reaction product of Bisphenol A (i.e. 2,2-bis(4-hydroxyphenyl)propane) and epichlorohydrin, e.g. the resins sold under the registered Trade Mark Araldite by Ciba-Geigy Ltd., or on the reaction product of epichlorohydrin with a phenol-formaldehyde resin of relatively low molecular weight, e.g. epoxy-Novolaks (available, for example from Dow), or other modified epoxy resins as disclosed in 'UV Curing Science and Technology' (Technology Marketing Corp. Stamford, Conn). Reactive diluents such as glycidyl ethers, glycidyl acrylates, 4-vinylcyclohexene dioxide, limonene dioxide, 1,2-cyclohexene oxide and 3,4-epoxycyclohexylmethyl 3,4-cyclohexanecarboxylate, may be used as viscosity modifying agents for such epoxy resins. The reactive diluent may be employed where necessary to render the epoxy resin dispersible in an aqueous medium. The use of excess reactive diluent is however to be avoided as it results in a softer film and an increase in curing time. The epoxy component or components are generally present in a proportion of 10–60%, preferably 25 to 50%, by weight of the composition.

Enhanced emulsion stability of the new compositions can be achieved by the addition of a water-soluble colloid and preferably a surfactant, normally a non-ionic surfactant. The proportion of such surfactant is preferably 0 to 5% by weight of the composition. Suitable water-soluble colloids include polyvinylalcohol, gelatin, cellulose ethers, such as hydroxyethylcellulose or hydroxypropyl cellulose, casein, and polyvinylpyrrolidone. Such colloid carriers are not insolubilised by the photoinitiator employed in the new compositions but are physically entrapped in the cured polymer matrix. The compositions of the invention normally contain 4 to 14%, and preferably 6 to 10%, of such colloid by weight.

It may be desirable to include in the compositions of the invention an inert filler which may be a polymer, e.g. a vinylacetate homopolymer or copolymer in emulsion or solid form, or another filler which may be, for example, starch, or an inorganic filler such as silica, kaolin or titanium dioxide. The purpose of such fillers is to modify the properties of the dried film to render it more suitable for the end purpose contemplated. The proportion of filler may be 0 to 10% by weight of the composition.

A plasticiser e.g. a dialkylphthalate or a phosphate ester, may be added in a proportion up to 10%, but preferably only 0 to 5%, by weight of the composition to improve the flexibility of the cured composition. A biocide may be added to prevent fungal growth in the stored emulsion, preferably in a proportion of no more than 0 to 1% by weight of the composition.

The photosensitive composition may also contain a colourant which may give a coloured contrast on exposure to actinic radiation, in a proportion up to 1% by weight, as described in British specification No. 2100874 corresponding to U.S. application Ser. No. 629,759 filed July 13, 1984 as a divisional of application Ser. No. 389,487 filed June 17, 1982 and now abandoned.

The compositions of the present invention are aqueous and may contain 40 to 80%, preferably 50 to 70%, by weight of water, including water added in admixture with other ingredients, e.g. the water in any polymer solution included in the composition. A minor amount of other solvents, e.g. diacetone alcohol or acetone, may be added to improve the stability of the composition in small proportion, e.g. 0 to 5% by weight.

The composition of the present invention is coated onto a substance and dried. The dried film is then exposed image-wise to actinic radiation, and the exposed film is developed, e.g. with water to remove the unexposed areas. The hardness of the stencil can be increased by allowing the exposed film to stand in the dark prior to development. This post cure period toughens the stencil, but some "filling in" of fine detail is noticeable if the period is prolonged.

The images formed by photopolymerisation and development of the new compositions as described above can be used for preparing stencils for screen printing, or in any photographic process where resists, stencils or relief images are required, for example etching and plating resists for printing plates, nameplates, dials and circuit patterns, ink accepting images for lithographic masters, or negative stencils for positive reversal litho systems. Images can also serve as dye resists or printing matrices as well as visually coloured displays in reflective or transparent form. The suitability of the image for a specific application is determined primarily by the choice of epoxy resin and reactive diluent.

The following Examples illustrate the invention.

EXAMPLE 1

|  | Parts by Weight |
| --- | --- |
| 13% aqueous solution of polyvinyl alcohol; GH 20[1] | 85 |
| Butanedioldiglycidylether; RD 2[2] | 25 |
| Epoxy resin; Araldite 6100[3] | 20 |
| Water | 15 |
| diphenyliodonium hexafluorophosphate | 4 |
| Reactive diluent; CY179[4] | 3.6 |
| acetone | 3 |
| 15% aqueous dispersion C I Pigment Violet 23 | 1 |
| Polymer filler; VAGD[5] | 0.8 |
| diacetone alcohol | 0.6 |
| Sensitizer; FC 510[6] | 0.5 |
| Surfactant; Berol O2[7] | 0.3 |

[1] GH 20 is high molecular weight 88% hydrolysed (12% residual acetate) polyvinylalcohol obtainable from Gohsenol.
[2] RD 2 is butanedioldiglycidyl ether obtainable from Ciba Geigy.
[3] Araldite 6100 is a Bisphenol A/epichlorhydrin epoxy resin obtainable from Ciba Geigy.
[4] CY 179 is 3,4-epoxycyclohexylmethyl-3,4-cyclohexane-carboxylate obtainable from Ciba Geigy.
[5] VAGD is a polyvinylchloride polyvinylacetate copolymer obtainable from Union Carbide.
[6] FC 510 is 9,10-diethoxyanthracene obtainable from 3M.
[7] Berol O2 is a nonylphenylpolyoxyethylene non-ionic surfactant containing 6 ethylene oxide residues per molecule obtainable from Berol Kemi (UK) Ltd.

The composition was coated onto both sides of a 90 threads/cm polyester filament mesh, dried and exposed through a photographic positive transparency to a 800 W mercury halide lamp at a distance of 1 meter for 200 seconds. After washing with water, a good stencil image was obtained.

A composition was formulated as described in Example 1 but omitting the diphenyliodonium hexafluorophosphate. The coated screen was exposed to a 800 W mercury halide lamp at a distance of 1 meter for 10 minutes. On washing with water the whole coated layer was removed indicating that no insolubilisation of the coating occurs in the absence of photoinitiator.

EXAMPLE 2

|  | Parts by Weight |
| --- | --- |
| 13% aqueous solution of polyvinyl alcohol; GH 20 | 100 |
| Butanediol diglycidyl ether; RD 2 | 20 |
| Epoxy resin; Araldite 6100 | 20 |
| Water | 15 |
| Reactive diluent; CY 179 | 7.2 |
| Triarylsulphonium salt; UVE 1014[8] | 5 |
| Acetone | 3 |
| Polymer filler; VAGD | 1.6 |
| diacetone alcohol | 1.2 |
| 15% aqueous dispersion C I Pigment Violet 23 | 1 |
| Sensitizer; FC 510 | 0.5 |
| Surfactant; Berol 02 | 0.3 |

[8]UVE 1014 is a triarylsulphonium salt obtainable from GEC.

The composition was coated onto both sides of a 90 threads/cm polyester filament mesh, dried and exposed through a positive transparency to a 800 W mercury halide lamp at a distance of 1 meter for 400 seconds. After washing with cold water a pigmented good stencil image was obtained.

EXAMPLE 3

|  | Parts by weight |
| --- | --- |
| 13% aqueous solution of polyvinyl alcohol; GH 20 | 75 |
| Epoxy resin; Araldite 6100 | 20 |
| Butanedioldiglycidyl ether; RD 2 | 20 |
| Dibutylphthalate (plasticizer) | 4 |
| Reactive diluent; CY 179 | 3.6 |
| Acetone | 3 |
| Diphenyliodonium hexafluorophosphate | 2.5 |
| 15% aqueous dispersion C I Pigment Violet 23 | 1 |
| Polymer filler; VAGD | 0.8 |
| diacetone alcohol | 0.6 |
| Sensitizer; FC 510 | 0.5 |
| Surfactant; Berol.O2 | 0.3 |

The composition was coated onto both sides of a 90 threads/cm polyester filament mesh, dried and exposed through a positive transparency to a 800 W mercury halide lamp at a distance of 1 meter for 500 seconds. The exposed screen was then allowed to stand in the dark for 30 minutes prior to washing out with water, after which a good stencil image was obtained.

EXAMPLE 4

|  | Parts by weight |
| --- | --- |
| 13% aqueous solution of polyvinyl alcohol; GH 20 | 85 |
| Epoxy resin; Araldite 6100 | 20 |
| Butanedioldiglycidyl ether; RD 2 | 20 |
| Polymer filler; VAGD | 17.4 |
| Reactive diluent; CY 179 | 7.9 |
| Diphenyliodonium hexafluorophosphate | 3.5 |
| Acetone | 3 |
| Diacetone alcohol | 1.3 |
| Sensitizer; FC 510 | 1.1 |
| 15% aqueous dispersion CI Pigment Violet 23 | 1 |
| Surfactant; Berol 02 | 0.3 |

The composition was coated onto both sides of a 15 threads/cm polyester filament mesh, dried and exposed through a positive transparency to a 800 W mercury halide lamp at a distance of 1 meter for 620 seconds. After washing with cold water a pigmented screen printing stencil was obtained.

EXAMPLE 5

|  | Parts by weight |
| --- | --- |
| 13% aqueous solution of polyvinyl alcohol; GH 20 | 85 |
| Epoxy resin; Epikote 255[9] | 50 |
| Water | 15 |
| Reactive diluent; CY 179 | 6.6 |
| Diphenyliodonium hexafluorophosphate | 4 |
| Acetone | 3 |
| Polymer filler; VAGD | 1.5 |
| Diacetone alcohol | 1.1 |
| 15% aqueous dispersion C I Pigment Violet 23 | 1 |
| Sensitizer; FC 510 | 0.9 |
| Surfactant; FC 170-C[10] | 0.2 |

[9]Epikote 255 is a water dispersable Bisphenol A/epichlorhydrin resin obtainable from Shell Chemical Co.
[10]FC 170-C is a fluorinated alkylbenzene polyoxyethylene obtainable from 3M.

The composition was coated onto both sides of a 90 threads/cm polyester filament mesh, dried and exposed through a positive transparency to a 800 W mercury halide lamp at a distance of 1 meter for 450 seconds. After washing with water a good stencil image was obtained.

EXAMPLE 6

|  | Parts by weight |
| --- | --- |
| 13% aqueous solution of polyvinyl alcohol; GH 20 | 100 |
| Epoxy resin; DEN 438[11] | 22.5 |
| Butanedioldiglycidylether, RD 2 | 18 |
| Reactive diluent; CY 179 | 6.5 |
| diphenyliodonium hexafluorophosphate | 4 |
| Acetone | 3 |
| Polymer filler; VAGD | 1.5 |
| Diacetone alcohol | 1.1 |
| 15% aqueous dispersion C. I. Pigment Violet 23 | 1 |
| Dibutylphthalate plasticizer | 1 |
| Sensitizer; FC 510 | 0.9 |
| Surfactant; Berol 02 | 0.5 |

[11]DEN 438 is an epoxy novolak resin obtainable from Dow Chemicals.

The composition was printed onto white cotton fabric through a 43 threads/cm screen printing mesh, allowed to dry at room temperature and passed through a HiDry (2×80 W/cm medium pressure Hg halide) UV drier, and a belt speed of 4.5 meters/min. A readily visible coloured image was achieved which could not be removed by flexing the material. The cured print and a printed unexposed sample were each wash tested at 60° C. for 30 minutes in the presence of a proprietary washing powder. The unexposed print washed off completely whereas the cured print showed no loss of colour or staining of adjacent white fabric.

EXAMPLE 7

|  | Parts by weight |
| --- | --- |
| 13% aqueous solution of polyvinyl alcohol; GH 20 | 100 |
| Reactive diluent; CY 179 | 36.5 |
| Epoxy resin; DEN 438 | 33 |
| Water | 15 |
| Diphenyliodonium hexafluorophosphate | 6 |
| Dibutylphthalate plasticizer | 4 |
| methylethylketone | 3 |
| Polymer filler; VAGD | 2.25 |
| Diacetone alcohol | 1.65 |
| Sensitizer; FC 510 | 1.35 |
| Surfactant; Berol O2 | 1 |

The composition was bar coated onto a chipboard surface and then passed through a HiDry UV drier (160 W/cm) at 1.5 meters/minutes belt speed. The coating cured to a tack free finish which could not be removed under aqueous conditions and could be sanded to give a smooth finish. A melamine resin laminate sheet as sold under the trade mark "Formica" was applied to the coated chipboard using a propietary adhesive and allowed to stand for the requisite period of time. Good adhesion was observed between the "Formica" sheet and the coated chipboard.

We claim:

1. A composition in the form of an aqueous dispersion comprising water, at least one dispersed cationically curable epoxy resin, a water-soluble colloid, and a photosensitive sulphonium or iodonium salt capable on exposure to actinic radiation of effecting cationic polymerisation and thus insolubilization of the said epoxy resin.

2. A composition according to claim 1 in which the curable compound is a mixture of (1) one or more low viscosity epoxy diluents selected from the group consisting of glycidyl ether, glycidyl acrylates, 4-vinylcyclohexene dioxide, limonene dioxide, 1,2-cyclohexene dioxide and 3,4-epoxycyclohexylmethyl-3,4-cyclohexanecarboxylate, and (2) one or more high molecular weight epoxy resins.

3. A composition according to claim 1 comprising, by weight of the said composition, 40–80% of water, 10–60% of epoxy resin (including reactive diluent), 4–14% of water soluble colloid, 1 to 10% of onium salt, and 0 to 50% of sensitiser effective in increasing the spectral sensitivity of the onium salt.

4. A composition according to claim 1 in which the photoinitiator is an iodonium salt of the formula:

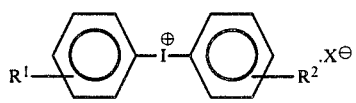

where $X^-$ is tetrafluoroborate, hexafluorophosphate, hexafluoroarsenate, hexafluoroantimonate, trifluoromethanesulphonate, or perchlorate, and $R_1$ and $R_2$ are each selected from hydrogen, halogen, straight or branched alkyl, alkoxy, aryl, acyl, nitro or cyano.

5. A composition according to claim 4 in which the photoinitiator is 4,4-dimethyldiphenyliodonium hexafluorophosphate or diphenyliodonium hexafluorophosphate.

6. A composition according to claim 1 in which the photoinitiator is a sulphonium salt of the formula:

$$(R^3)_a(R^4)_b(R^5)_c S^{\oplus}.X^{\ominus}$$

where $X^-$ is tetrafluoroborate, hexafluorophosphate, hexafluoroarsenate, trifluoromethanesulphonate, perchlorate or hexafluoroantimonate, $R^3$ is a monovalent aromatic radical, which may be substituted by one or more alkyl, aryl, alkoxy, hydroxy, phenoxy, thiophenoxy, mercaptan or acyl groups or halogen atoms, $R^4$ is a monovalent organic aliphatic radical selected from alkyl, cycloalkyl and substituted alkyl, $R^5$ is a polyvalent organic radical forming a heterocyclic or fused ring structure with $S^+$, a is a whole number from 0 to 3 inclusive, b is a whole number from 0 to 2 inclusive, and c is 0 or 1, and $a+b+c=3$.

7. A composition according to claim 6 in which the photoinitiator is a sulphonium salt of the formula:

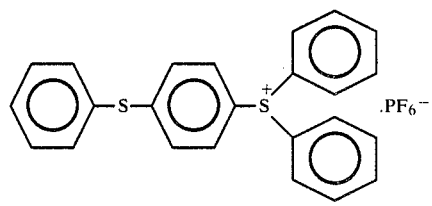

8. A composition according to claim 1 which also comprises a sensitizer to increase the spectral sensitivity of the photosensitive onium salt.

9. A composition according to claim 8, in which the said sensitiser is 9,10-diethoxyanthracene or an alkylated 9,10-diethoxyanthracene.

10. A composition according to claim 1 which also comprises a surfactant as dispersion stabilizers.

11. A composition according to claim 1 in which the said colloid is polyvinylalcohol, polyvinylpyrrolidone, gelatin, hydroxyethylcellulose or hydroxypropylcellulose.

12. A composition according to claim 1 which also comprises one or more of an inert polymeric filler, an inert organic filler, a plasticiser, an organic solvent, a biocide, a defoamer, a pigment, or a dye.

13. A composition according to claim 12 in which the said plasticizer is dibutylphthalate.

14. A composition according to claim 12 in which the said inert filler is a polyvinylacetate homopolymer, a polyvinylacetate-polyvinylchloride copolymer, starch, silica, kaolin or titanium dioxide.

15. A composition according to claim 12 comprising, by weight of the said composition, 50 to 70% of water, 25 to 50% of epoxy resin (including reactive diluent), 2 to 5% of iodonium or sulphonium salt, 0 to 3% of sensitiser effective in increasing the spectral sensitivity of the onium salt, 0 to 2% of an inert polymer, 0 to 2% of a surfactant, 0 to 3% of a plasticiser, 4 to 14% of a water-soluble colloid, and 0 to 15% of organic solvent.

16. A composition according to claim 10 in which the surfactant is a non-ionic surfactant.

17. A composition according to claim 12 in which the dye is one which gives a colored contrast on exposure to actinic light.

* * * * *